United States Patent [19]
Meisters et al.

[11] Patent Number: 5,858,606
[45] Date of Patent: Jan. 12, 1999

[54] HEAT SENSITIVE IMAGING ELEMENT AND A METHOD FOR PRODUCING LITHOGRAPHIC PLATES THEREWITH

[75] Inventors: Augustin Meisters, Gentbrugge; Ludo Van Rompuy; Jan Gilleir, both of Mortsel; Luc Leenders, Herentals, all of Belgium

[73] Assignee: AGFA-Gevaert, N.V., Mortsel, Belgium

Related U.S. Application Data

[60] Provisional application No. 60/037,966, Feb. 20, 1997.

[21] Appl. No.: 976,504

[22] Filed: Nov. 24, 1997

[30] Foreign Application Priority Data

Nov. 29, 1996 [EP] European Pat. Off. .............. 96119163

[51] Int. Cl.$^6$ .......................... G03C 1/494; G03C 1/496; G03C 8/28; G03F 7/06
[52] U.S. Cl. ........................ 430/200; 430/204; 430/271.1; 430/278.1; 430/302; 430/330; 430/346; 430/616; 430/964
[58] Field of Search ..................................... 430/200, 204, 430/203, 271.1, 278.1, 302, 330, 616, 964, 346

[56] References Cited

U.S. PATENT DOCUMENTS

| 3,685,993 | 8/1972 | Mukherjee . |
| 3,811,886 | 5/1974 | Mukherjee . |

FOREIGN PATENT DOCUMENTS

| 0 698 822 A2 | 2/1996 | European Pat. Off. . |
| 0 698 822 A3 | 2/1996 | European Pat. Off. . |
| 1 454 271 | 11/1976 | United Kingdom . |
| WO 95/07822 | 3/1995 | WIPO . |

*Primary Examiner*—Richard L. Schilling
*Attorney, Agent, or Firm*—Breiner & Breiner

[57] ABSTRACT

According to the present invention there is provided a thermosensitive imaging element for obtaining a lithographic printing plate comprising on a hydrophilic surface of a support a layer comprising an organic metallic salt and in the same or an adjacent layer an organic reducing agent and a compound capable of converting light into heat, said organic metallic salt being reducible on heating by said reducing agent to an ink-accepting compound or to a compound which can react with a hydrophobizing agent to an ink-accepting compound, characterized in that said layer comprising an organic metallic salt comprises a hydrophobic binder in an amount between 0.00 g/m$^2$ and 0.25 g/m$^2$ and a hydrophilic binder in an amount between 0.00 g/m$^2$ and 5.00 g/m$^2$.

11 Claims, No Drawings

HEAT SENSITIVE IMAGING ELEMENT AND A METHOD FOR PRODUCING LITHOGRAPHIC PLATES THEREWITH

DESCRIPTION

Priority is claimed under 35 USC 119(E) from Provisional application Ser. No. 60/037,966 filed Feb. 20, 1997.

FIELD OF THE INVENTION

The present invention relates to a heat-sensitive metallic salt based imaging element and to a method for producing a lithographic printing plate in a convenient manner by means of said imaging element.

BACKGROUND OF THE INVENTION

Lithography is the process of printing from specially prepared surfaces, some areas of which are capable of accepting lithographic ink, whereas other areas, when moistened with water, will not accept the ink. The areas accepting ink are the printing image areas and the ink-rejecting areas are the background areas.

In the art of photolithography, a photographic material is made image-wise receptive to oily or greasy inks in the photo-exposed (negative-working) or in the non-exposed (positive-working) areas on a hydrophilic background. Common photographic materials employed for making a lithographic printing plate are materials based on a photosensitive polymer or are silver salt diffusion transfer materials.

Silver salt diffusion transfer materials offer the advantage of having a high speed in a broad spectral range, whereas common photosensitive polymer materials are only sensitive to light of a narrow spectral range, commonly between 300 and 500 nm. Furthermore, photosensitive polymers do not offer the speed of a silver halide material.

Silver salt diffusion transfer materials require the use of liquid processing baths. As a consequence, the formation of a lithographic printing plate by means of such materials takes much time and requires much labour. The chemicals used in the wet processing are harmful to the human body and they soil the cloths and hands of the operators.

In GB-P 1,454,271 a method of making a lithographic printing plate in a dry manner has been described, which method comprises image-wise exposing to actinic radiation the sensitive layer of a photosensitive heat-processable photographic material, which layer contains a binder and, as part of an image-forming system, a light-insensitive reducible metal salt of a straight-chain fatty acid having at least 10 carbon atoms, heating the layer to develop a first image therein by reduction of the metal salt and thereby liberate fatty acid, and holding the layer in contact with a receiving sheet e.g. a hydrophilic grained anodized aluminium foil, whilst being held at a temperature above the melting point of the fatty acid so that fatty acid-containing material transfers from the developed areas to the receiving sheet to produce an oleophilic transfer image. However an important disadvantage is that the handling of said imaging element is time-consuming and cumbersome.

SUMMARY OF THE INVENTION

It is an object of the present invention to provide a heat-sensitive metallic salt based imaging element for making in a convenient way a lithographic printing plate having excellent printing properties.

It is another object of the present invention to provide a method for producing in a convenient way a negative working lithographic printing plate of a high quality by means of said heat-sensitive metallic salt based imaging element.

Further objects of the present invention will become clear from the description hereafter.

According to the present invention there is provided a thermosensitive imaging element for obtaining a lithographic printing plate comprising on a hydrophilic surface of a support a layer comprising an organic metallic salt and in the same or an adjacent layer an organic reducing agent and a compound capable of converting light into heat, said organic metallic salt being reducible on heating by said reducing agent to an ink-accepting compound or to a compound which can react with a hydrophobizing agent to an ink-accepting compound, characterized in that said layer comprising an organic metallic salt comprises a hydrophobic binder in an amount between 0.00 g/m$^2$ and 0.25 g/m$^2$ and a hydrophilic binder in an amount between 0.00 g/m$^2$ and 5.00 g/m$^2$.

According to the present invention there is also provided a method for obtaining a lithographic printing plate comprising the steps of:
(a) image-wise or information-wise exposing to light or heat an imaging element as described above, and
(b) developing said exposed imaging element with an aqueous developing solution in order to remove the unexposed areas and thereby form a lithographic printing plate.

4. Detailed Description of the Invention

It has been found that lithographic printing plates of high quality can be obtained according to the method of the present invention using an imaging element as described above. More precisely it has been found that said printing plates are of high quality and are provided in a convenient way, thereby offering economical and ecological advantages.

The layer comprising an organic metal salt according to the invention comprises a hydrophobic binder preferably in an amount between 0.00 g/m$^2$ and 0.15 g/m$^2$, more preferably said layer comprises no hydrophobic binder.

Suitable hydrophobic binders according to the invention are preferably thermoplastic water insoluble resins wherein the ingredients can be dispersed homogeneously or form therewith a solid-state solution. For that purpose all kinds of natural, modified natural or synthetic resins may be used, e.g. cellulose derivatives such as ethylcellulose, cellulose esters, carboxymethylcellulose, starch ethers, polymers derived from $\alpha,\beta$-ethylenically unsaturated compounds such as polyvinyl chloride, after-chlorinated polyvinyl chloride, copolymers of vinyl chloride and vinylidene chloride, copolymers of vinyl chloride and vinyl acetate, polyvinyl acetate and partially hydrolyzed polyvinyl acetate, polyvinyl alcohol, polyvinyl acetals, e.g. polyvinyl butyral, copolymers of acrylonitrile and acrylamide, polyacrylic acid esters, polymethacrylic acid esters and polyethylene or mixtures thereof. A particularly suitable ecologically interesting (halogen-free) binder is polyvinyl butyral. A polyvinyl butyral containing some vinyl alcohol units is marketed under the trade name BUTVAR B79 of Monsanto U.S.A.

The above mentioned polymers or mixtures thereof forming the hydrophobic binder may be used in conjunction with waxes or "heat solvents" also called "thermal solvents" or "thermosolvents" improving the penetration of the reducing agent(s) and thereby the reaction speed of the redox-reaction at elevated temperature.

By the term "heat solvent" in this invention is meant a non-hydrolyzable organic material which is in solid state at temperatures below 50° C. but becomes on heating above that temperature a plasticizer for the binder of the layer wherein they are incorporated and possibly act then also as a solvent for at least one of the redox-reactants, e.g. the reducing agent for the organic metallic salt. Useful for that purpose are a polyethylene glycol having a mean molecular weight in the range of 1,500 to 20,000 described in U.S. Pat. No. 3,347,675. Further are mentioned compounds such as urea, methyl sulfonamide and ethylene carbonate being heat solvents described in U.S. Pat. No. 3,667,959, and compounds such as tetrahydro-thiophene-1,1-dioxide, methyl anisate and 1,10-decanediol being described as heat solvents in Research Disclosure, December 1976, (item 15027) pages 26–28. Still other examples of heat solvents have been described in U.S. Pat. Nos. 3,438,776, and 4,740,446, and in published EP-A 0 119 615 and 0 122 512 and DE-A 3 339 810. Said heat solvents are used in an amount between 0.00 g/m² and 0.10 g/m².

The layer comprising an organic metal salt according to the invention comprises a hydrophilic binder preferably in an amount between 0.00 g/m² and 2.00 g/m², more preferably said layer comprises no hydrophilic binder.

The hydrophilic binder is preferably a hydrophilic colloid, usually a protein, most preferably gelatin. Gelatin can, however, be replaced in part or integrally by synthetic, semi-synthetic, or natural polymers. Synthetic substitutes for gelatin are e.g. polyvinyl alcohol, poly-N-vinyl pyrrolidone, polyvinyl imidazole,, polyvinyl pyrazole, polyacrylamide, polyacrylic acid, and derivatives thereof, in particular copolymers thereof. Natural substitutes for gelatin are e.g. other proteins such as zein, albumin and casein, cellulose, saccharides, starch, and alginates. In general, the semi-synthetic substitutes for gelatin are modified natural products e.g. gelatin derivatives obtained by conversion of gelatin with alkylating or acylating agents or by grafting of polymerizable monomers on gelatin, and cellulose derivatives such as hydroxyalkyl cellulose, carboxymethyl cellulose, phthaloyl cellulose, and cellulose sulphates. Preferably gelatin or a gelatin derivative is used in combination with synthetic hydrophilic polymers e.g. poly-N-vinyl pyrrolidone and polyvinyl alcohol.

Suitable organic metallic salts are light-insensitive metallic salts. Substantially light-insensitive organic metallic salts particularly suited for use according to the present invention are metallic salts of aliphatic carboxylic acids known as fatty acids, wherein the aliphatic carbon chain has preferably at least 12 C-atoms. Preferably said metallic organic salts are ferric or ceric organic salts. Particularly preferred are silver organic salts e.g. silver laurate, silver palmitate, silver stearate, silver hydroxystearate, silver oleate and silver behenate, and likewise silver dodecyl sulphonate described in U.S. Pat. No. 4,504,575 and silver di-(2-ethylhexyl)-sulfosuccinate described in published European patent application 227 141. Useful modified aliphatic carboxylic acids with thioether group are described e.g. in GB-P 1,111,492.

Preferably, the organic metallic salt comprising layer comprises between 0.1 mmole/m² and 10 mmole/m² of metallic salt, more preferably between 0.3 mmole/m² and 3 mmole/m² of metallic salt.

Suitable organic reducing agents for the reduction of substantially light-insensitive organic metallic salts are organic compounds containing at least one active hydrogen atom linked to O, N or C, such as is the case in aromatic di- and tri-hydroxy compounds, e.g. hydroquinone and substituted hydroquinones, catechol, pyrogallol, gallic acid and gallates; aminophenols, METOL (tradename), p-phenylenediamines, alkoxynaphthols, e.g. 4-methoxy-1-naphthol described in U.S. Pat. No. 3,094,417, pyrazolidin-3-one type reducing agents, e.g. PHENIDONE (tradename), pyrazolin-5-ones, indanedione-1,3 derivatives, hydroxytetrone acids, hydroxytetronimides, reductones, and ascorbic acid. Representatives for thermally activated reduction of organic metallic salts are described e.g. in U.S. Pat. Nos. 3,074,809, 3,080,254, 3,094,417, 3,887,378 and 4,082,901.

The thermosensitive element comprises preferably between 0.07 mmole/m² and 7 mmole/m² of organic reducing agent, more preferably between 0.2 mmole/m² and 2 mmole/m² of organic reducing agent.

Particularly suited organic reducing agents for use in thermally activated reduction of the substantially light insensitive metallic salts are organic compounds containing in their structure two free hydroxy groups (—OH) in ortho-position on a benzene nucleus as is the case in catechol, pyrogallol and derivatives and polyhydroxy spiro-bis-indane compounds corresponding to the following general formula (I) which are preferred for use in the recording material according to the present invention:

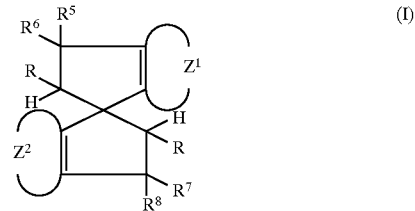

wherein:
R represents hydrogen or alkyl, e.g. methyl or ethyl,
each of $R^5$ and $R^6$ (same or different) represents, an alkyl group, preferably methyl group or a cycloalkyl group, e.g. cyclohexyl group,
each of $R^7$ and $R^8$ (same or different) represents, an alkyl group, preferably methyl group or a cycloalkyl group, e.g. cyclohexyl group, and
each of $Z^1$ and $Z^2$ (same or different) represents the atoms necessary to close an aromatic ring or ring system, e.g benzene ring, substituted with at least two hydroxyl groups in ortho- or para-position and optionally further substituted with at least one hydrocarbon group, e.g an alkyl or aryl group.

Particularly useful are the polyhydroxy-spiro-bis-indane compounds described in U.S. Pat. No. 3,440,049 as photographic tanning agent, more especially 3,3,3',3'-tetramethyl-5,6,5',6'-tetrahydroxy-1,1'-spiro-bis-indane (called indane I) and 3,3,3',3'-tetramethyl-4,6,7,4',6',7'-hexahydroxy-1,1'-spiro-bis-indane (called indane II). Indane is also known under the name hydrindene.

Preferably the reducing agent is added to the heat sensitive layer but all or part of the reducing agent may be added to one or more other layers on the same side of the support as the heat sensitive layer.

The recording material may contain auxiliary reducing agents having poor reducing power in addition to the main reducing agent described above preferably in the heat sensitive layer containing the organic metallic salt. For that purpose preferably sterically hindered phenols are used.

Sterically hindered phenols as described e.g. in U.S. Pat. No. 4,001,026 are examples of such auxiliary reducing agents that can be used in admixture with said organic metallic salts without premature reduction reaction and fog-formation at room temperature.

The imaging element further includes a compound capable of converting light to heat. This compound is preferably comprised in the image forming layer but can also be provided in a layer adjacent to the image forming layer. Suitable compounds capable of converting light into heat are preferably infrared absorbing components although the wavelength of absorption is not of particular importance as long as the absorption of the compound used is in the wavelength range of the light source used for image-wise exposure. Particularly useful compounds are for example dyes and in particular infrared dyes, carbon black, metal carbides, borides, nitrides, carbonitrides, bronze-structured oxides and oxides structurally related to the bronze family but lacking the A component e.g. $WO_{2.9}$. It is also possible to use conductive polymer dispersion such as polypyrrole or polyaniline-based conductive polymer dispersions. The lithographic performance and in particular the print endurance obtained depends on the heat-sensitivity of the imaging element. In this respect it has been found that carbon black yields very good and favorable results.

A light to heat converting compound in connection with the present invention is most preferably added to the image forming layer but at least part of the light to heat converting compound may also be comprised in a neighbouring layer.

According to one embodiment of the present invention, the lithographic base can be an anodised aluminum. A particularly preferred lithographic base is an electrochemically grained and anodised aluminum support. According to the present invention, an anodised aluminum support may be treated to improve the hydrophilic properties of its surface. For example, the aluminum support may be silicated by treating its surface with sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or can be carried out at a slightly elevated temperature of about 30° to 50° C. A further interesting treatment involves rinsing the aluminum oxide surface with a bicarbonate solution. It is further evident that one or more of these post treatments may be carried out alone or in combination.

According to another embodiment in connection with the present invention, the lithographic base comprises a flexible support, such as e.g. paper or plastic film, provided with a cross-linked hydrophilic layer. A particularly suitable cross-linked hydrophilic layer may be obtained from a hydrophilic binder cross-linked with a cross-linking agent such as formaldehyde, glyoxal, polyisocyanate or a hydrolysed tetra-alkylorthosilicate. The latter is particularly preferred.

As hydrophilic binder there may be used hydrophilic (co)polymers such as for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60 percent by weight, preferably 80 percent by weight.

The amount of crosslinking agent, in particular of tetraalkyl orthosilicate, is preferably at least 0.2 parts by weight per part by weight of hydrophilic binder, preferably between 0.5 and 5 parts by weight, more preferably between 1.0 parts by weight and 3 parts by weight.

A cross-linked hydrophilic layer in a lithographic base used in accordance with the present embodiment preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica can be added e.g. silica prepared according to Stober as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the cross-linked hydrophilic layer is given a uniform rough texture consisting of microscopic hills and valleys, which serve as storage places for water in background areas.

The thickness of a cross-linked hydrophilic layer in a lithographic base in accordance with this embodiment may vary in the range of 0.2 to 25 $\mu$m and is preferably 1 to 10 $\mu$m.

Particular examples of suitable cross-linked hydrophilic layers for use in accordance with the present invention are disclosed in EP-A 601240, GB-P-1419512, FR-P-2300354, U.S. Pat. No. 3,971,660, U.S. Pat. No. 4,284,705 and EP-A 514490.

As flexible support of a lithographic base in connection with the present embodiment it is particularly preferred to use a plastic film e.g. substrated polyethylene terephthalate film, cellulose acetate film, polystyrene film, polycarbonate film etc. The plastic film support may be opaque or transparent.

It is particularly preferred to use a polyester film support to which an adhesion improving layer has been provided. Particularly suitable adhesion improving layers for use in accordance with the present invention comprise a hydrophilic binder and colloidal silica as disclosed in EP-A 619524, EP-A 620502 and EP-A 619525. Preferably, the amount of silica in the adhesion improving layer is between 200 mg per $m^2$ and 750 mg per $m^2$. Further, the ratio of silica to hydrophilic binder is preferably more than 1 and the surface area of the colloidal silica is preferably at least 300 $m^2$ per gram, more preferably at least 500 $m^2$ per gram.

The hydrophilic layer of a support as described above, is preferably coated with a layer containing physical development nuclei.

Said layer preferably comprises physical development nuclei in an amount ranging from 0.1 mg to 20 mg/$m^2$, more preferably in an amount from 0.5 to 5 mg/$m^2$. Said layer containing physical development nuclei may be free of hydrophilic binder but preferably comprises small amounts upto 80% by weight of the total weight of said layer of a hydrophilic colloid e.g. polyvinyl alcohol or polyvinyl acrylic acid to improve the hydrophilicity of said layer.

Preferred development nuclei for use in accordance with the present invention are sulphides of heavy metals e.g. sulphides of antimony, bismuth, cadmium, cobalt, lead, nickel, palladium, platinum, silver, and zinc. Other suitable development nuclei are salts such as e.g. selenides, polyselenides, polysulphides, mercaptans, and tin (II) halides. Heavy metals, preferably silver, gold, platinum, palladium, and mercury can be used in colloidal form. Especially suitable development nuclei in connection with the present invention are palladium sulphide nuclei and colloidal silver.

In accordance with a method of the present invention for obtaining a printing plate, the imaging element is image-wise exposed to light or heat and subsequently developed with an aqueous alkaline solution.

Image-wise exposure in connection with the present invention can be effected with a thermal means e.g. a thermal printing head but is preferably an image-wise scanning exposure involving the use of a laser or L.E.D. It is highly preferred in connection with the present invention to use a laser emitting in the infrared (IR) and/or near-infrared, i.e. emitting in the wavelength range 700–1500 nm. Particularly preferred for use in connection with the present invention are laser diodes emitting in the near-infrared.

After the development of an image-wise exposed imaging element with an aqueous solution and drying the obtained plate can be used as a printing plate as such.

The developing aqueous solution may comprise hydrophobizing agents for improving the hydrophobicity of the metallic image, preferably a silver image obtained in the metallic salt containing layer. Generally these compounds contain a mercapto group or thiolate group and one or more hydrophobic substituents. Particularly preferred hydrophobizing agents are mercapto-1,3,4-thiadiazoles as described in DE-A 1,228,927 and in U.S. Pat. No. 4,563,410, 2-mercapto-5-alkyl-oxa-3,4-diazole, 3-mercapto-5-alkyl-1, 2,4-triazoles and long chain (at least 5 carbon atoms) alkyl substituted mercaptotetrazoles. Other preferred hydrophobic compounds correspond to one of the following formulas:

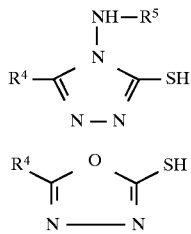

wherein $R^5$ represents hydrogen or an acyl group, $R^4$ represents alkyl, aryl or aralkyl. Most preferably used compounds are compounds according to one of the above formulas wherein $R^4$ represents an alkyl containing 3 to 16 C-atoms.

These hydrophobizing compounds can be added to the aqueous developing solution in an amount of preferably 0.1 to 3 g per liter and preferably in admixture with 1-phenyl-5-mercaptotetrazole, the latter compound may be used in amounts of e.g. 50 mg to 1.2 g per liter of solution, which may contain a minor amount of ethanol to improve the dissolution of said compounds. The hydrophobizing agents can be used alone or in combination with each other.

The developing aqueous solution can also contain additives ingredients which improves the ink-repelling characteristics of the hydrophilic surface.

Additives improving the oleophilic ink-repellency of the hydrophilic surface areas are e.g. carbohydrates such as acidic polysaccharides like gum arabic, carboxymethylcellulose, sodium alginate, propylene glycol ester of alginic acid, hydroxyethyl starch, dextrin, hydroxyethylcellulose, polyvinyl pyrrolidone, polystyrene sulphonic acid, polyglycols being the reaction products of ethyleneoxide and/or propyleneoxide with water or an alcohol and polyvinyl alcohol. Optionally, hygroscopic substances e.g. sorbitol, glycerol, tri(hydroxyethyl)ester of glycerol, and turkish red oil may be added.

In accordance with the present invention the imaging element can also be processed after mounting the imagewise and overall exposed imaging element on a print cylinder of a printing press. According to a preferred embodiment, the printing press is then started and while the print cylinder with the imaging element mounted thereon rotates, the dampener rollers that supply dampening liquid are dropped on the imaging element and subsequent thereto the ink rollers are dropped. Generally after about 10 revolutions of the print cylinder the first clear and useful prints are obtained.

According to an alternative method, the ink rollers and dampener rollers may be dropped simultaneously or the ink rollers may be dropped first.

Suitable dampening liquids that can be used in connection with the present invention are aqueous solutions generally having an acidic pH and comprising an alcohol such as isopropanol. With regard to dampening liquids useful in the present invention, there is no particular limitation and commercially available dampening liquids, also known as fountain solutions, can be used.

According to an alternative method, the imaging element is first mounted on the print cylinder of the printing press and then image-wise exposed directly on the press. Subsequent to exposure, the imaging element can be developed as described above.

The present invention will now be further illustrated by way of the following examples without any intention to limit the invention thereto. All parts are by weight unless stated otherwise.

EXAMPLE 1

A 0,30 mm thick aluminium foil (AA 1050) was degreased by immersing the foil in an aqueous solution containing 10% phosphoric acid and subsequently etched in an aqueous solution containing 2 g/l of sodium hydroxide. The foil was then electrochemically grained using an alternating current in an aqueous solution containing 4 g/l of hydrochloric acid and 4 g/l of hydroboric acid at a temperature of 35° C. to form a surface topography with an average center-line roughness Ra of 0,6 μm. The aluminium plate was then desmutted with an aqueous solution containing 30% of sulfuric acid at 60° C. for 120 seconds. The foil was subsequently subjected to anodic oxidation in a 20% sulfuric acid aqueous solution to form an anodic oxidation film of 3.0 g/m² of $Al_2O_3.H_2O$, treated with an aqueous solution containing 20 g/l of $NaHCO_3$ at 45° C. for 30 sec and then rinsed with demineralised water and dried.

Said grained, anodized and posttreated aluminum support was then coated with a layer containing 1.1 mg/m² PdS as physical development nuclei.

Said layer was then overcoated with an aqueous dispersion of silver behenate, mixed with a solution of methyl gallate and an infrared-absorbing dye. The solution was prepared as follows:

A dispersion of 20% silver behenate in water was prepared by adding 2% of an emulgator (Ultravon from Ciba-Geigy). The dispersion was homogenized by microfluidizer treatment.

A solution was prepared by mixing 1.25 g of the above binderless 20% silver behenate dispersion with 68 mg of methyl gallate and 130 mg of the IR-absorbing dye of the following structure:

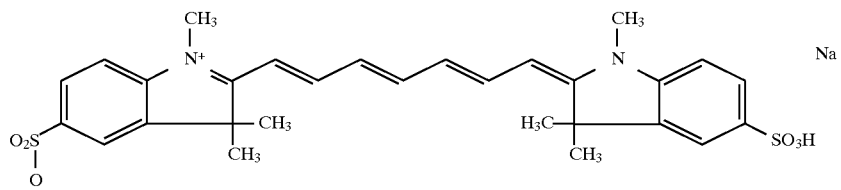

The mixture was made up with water to a final volume of 25 ml. The mixture was then coated at a thickness of 50 μm.

After drying with hot air, the imaging element was imaged on an external-drum laser recorder, aquipped with an 830 nm diode laser, operated at an output level of 40 to 120 mW.

The exposed imaging element was then developed with deionized water and a cotton pad, eliminating the coating of the non-exposed areas. A dark metallic silver deposition had formed on the exposed areas.

The resulting exposed and developed imaging element was then used as a printing plate on a printing press Heidelberg GTO 52, using K+E 197 ink and Rotamatic fountain fluid. The image written on the plate was perfectly reproduced on paper and yielded an excellent resolution.

We claim:

1. A thermosensitive imaging element for obtaining a lithographic printing plate comprising on a hydrophilic surface of a support a layer comprising an organic metallic salt and in the same or an adjacent layer an organic reducing agent and a compound capable of converting light into heat, said organic metallic salt being reducible on heating by said reducing agent to an ink-accepting compound or to a compound which can react with a hydrophobizing agent to an ink-accepting compound, wherein said layer comprising an organic metallic salt comprises a hydrophobic binder in an amount between 0.00 g/m$^2$ and 0.25 g/m$^2$ and a hydrophilic binder in an amount between 0.00 g/m$^2$ and 5.00 g/m$^2$.

2. A thermosensitive imaging element according to claim 1 wherein said organic metallic salt is an organic silver salt.

3. A thermosensitive imaging element according to claim 1 wherein a layer, comprising physical developing nuclei is present contiguous to said hydrophilic surface of a support.

4. A thermosensitive imaging element according to claim 1 wherein said hydrophilic surface of a support is anodized aluminum or comprises a flexible support having thereon a cross-linked hydrophilic layer.

5. A thermosensitive imaging element according to claim 1 wherein said compound capable of converting light into heat is an infrared absorbing compound.

6. A method for preparing a lithographic plate comprising the following steps:
   image-wise or information-wise exposing to heat an imaging element according to claim 1 and
   rinsing the exposed imaging element with an aqueous solution thereby removing the layers on said hydrophilic surface of a support and exposing the reduced organic metallic salt.

7. A method for preparing a lithographic plate comprising the following steps:
   image-wise or information-wise exposing an imaging element according to claim 5 to light which can be absorbed by said compound capable of converting light into heat and
   rinsing the exposed imaging element with an aqueous solution thereby removing the layers on said hydrophilic surface of a support and exposing the reduced organic metallic salt.

8. A method for preparing a lithographic plate according to claim 7 wherein said irradiating is effected by a laser.

9. A method for preparing a lithographic plate according to claim 6 wherein the exposed and rinsed imaging element is treated with a solution comprising a hydrophobizing agent.

10. A method for preparing a lithographic plate according to claim 6 wherein said thermosensitive imaging element is rinsed after mounting the image-wise or information-wise exposed imaging element on a print cylinder of a printing press.

11. A method for preparing a lithographic plate according to claim 6 wherein said thermosensitive imaging element is image-wise or information-wise exposed while being mounted on a print cylinder of a printing press.

* * * * *